United States Patent
Cheng et al.

(10) Patent No.: US 9,418,902 B2
(45) Date of Patent: Aug. 16, 2016

(54) FORMING ISOLATED FINS FROM A SUBSTRATE

(71) Applicant: GLOBALFOUNDRIES Inc., Grand Cayman (KY)

(72) Inventors: Kangguo Cheng, Schenectady, NY (US); Shom S. Ponoth, Gaithersburg, MD (US); Balasubramanian Pranatharthiharan, Watervliet, NY (US); Theodorus E. Standaert, Clifton Park, NY (US); Tenko Yamashita, Schenectady, NY (US)

(73) Assignee: Globalfoundries Inc., Grand Cayman (KY)

( * ) Notice: Subject to any disclaimer, the term of this patent is extended or adjusted under 35 U.S.C. 154(b) by 106 days.

(21) Appl. No.: 14/050,661

(22) Filed: Oct. 10, 2013

(65) Prior Publication Data
US 2015/0102409 A1  Apr. 16, 2015

(51) Int. Cl.
| | |
|---|---|
| *H01L 21/84* | (2006.01) |
| *H01L 21/762* | (2006.01) |
| *H01L 27/12* | (2006.01) |
| *H01L 29/66* | (2006.01) |

(52) U.S. Cl.
CPC ........ *H01L 21/845* (2013.01); *H01L 21/76243* (2013.01); *H01L 27/1211* (2013.01); *H01L 29/66795* (2013.01); *H01L 29/66545* (2013.01)

(58) Field of Classification Search
CPC .............. H01L 21/823431; H01L 21/823821; H01L 21/76243; H01L 21/76202; H01L 21/845
See application file for complete search history.

(56) References Cited

U.S. PATENT DOCUMENTS

| | | | |
|---|---|---|---|
| 7,320,908 B2 * | 1/2008 | Son ................. | H01L 21/823481 257/E21.429 |
| 7,723,171 B2 * | 5/2010 | Yagishita et al. ............. | 438/197 |
| 7,960,734 B2 | 6/2011 | Lenoble | |
| 8,039,326 B2 | 10/2011 | Knorr et al. | |
| 8,048,723 B2 * | 11/2011 | Chang ................. | H01L 29/7851 257/192 |
| 8,202,768 B2 | 6/2012 | Lander | |
| 8,263,462 B2 * | 9/2012 | Hung ................ | H01L 29/66795 257/288 |
| 8,395,195 B2 * | 3/2013 | Chang ................. | H01L 29/7853 257/255 |
| 8,691,640 B1 * | 4/2014 | LiCausi et al. ................ | 438/156 |

(Continued)

FOREIGN PATENT DOCUMENTS

CN    102832133 A    12/2012

OTHER PUBLICATIONS

Droz et al., "Oxidized Silicon-On-Insulator (OxSOI) from bulk silicon: a new photonic platform"., Mar. 15, 2010, vol. 18, No. 6/ Optics Express 5785.

*Primary Examiner* — Jessica Stultz
*Assistant Examiner* — Sean Hagan
(74) *Attorney, Agent, or Firm* — Heslin Rothenberg Farley & Mesiti P.C.; George Blasiak

(57) ABSTRACT

A method of isolating a semiconductor fin from an underlying substrate including forming a masking layer around a base portion of the fin, forming spacers on a top portion of the fin above the masking layer, removing the masking layer to expose the base portion of the fin, and converting the base portion of the fin to an isolation region that electrically isolates the fin from the substrate. The base portion of the fin may be converted to an isolation region by oxidizing the base portion of the fin, using for example a thermal oxidation process. While converting the base portion of the fin to an isolation region, the spacers prevent the top portion of the fin from also being converted.

12 Claims, 10 Drawing Sheets

(56) References Cited

U.S. PATENT DOCUMENTS

| | | | | |
|---|---|---|---|---|
| 8,766,363 B2* | 7/2014 | Cheng | H01L 21/845 257/255 | |
| 8,896,067 B2* | 11/2014 | Bergendahl | H01L 21/823431 257/368 | |
| 8,940,602 B2* | 1/2015 | Basker | H01L 29/785 257/368 | |
| 8,987,823 B2* | 3/2015 | Cheng | H01L 21/845 257/350 | |
| 2009/0047791 A1* | 2/2009 | Dobuzinsky et al. | 438/705 | |
| 2009/0278196 A1* | 11/2009 | Chang | H01L 21/823412 257/328 | |
| 2010/0163971 A1 | 7/2010 | Hung et al. | | |
| 2011/0027948 A1 | 2/2011 | Ren et al. | | |
| 2011/0260227 A1 | 10/2011 | Kim et al. | | |
| 2013/0005103 A1 | 1/2013 | Liu et al. | | |
| 2013/0020640 A1* | 1/2013 | Chen et al. | 257/347 | |
| 2013/0034960 A1 | 2/2013 | Hu et al. | | |
| 2014/0091394 A1* | 4/2014 | Li | H01L 21/823431 257/368 | |

* cited by examiner

FORMING ISOLATED FINS FROM A SUBSTRATE

BACKGROUND

The present invention relates to semiconductor devices, and particularly to isolating semiconductor fins from a substrate.

It is becoming increasing common to fabricate devices that include three-dimensional topographical features such as fins. Once such device is a fin field effect transistor (finFET), which may provide solutions to field effect transistor (FET) scaling problems that may occur at, and below, the 22 nm node. FinFET structures include at least one narrow semiconductor fin, a source region located on one end of the semiconductor fin, and a drain region located on the opposite end of the semiconductor fin. The fin may gated on at least two sides of each of the semiconductor fin between the source region and the drain region. By applying a voltage to the gate, the conductivity of the fin may be changed to allow current to flow from the source region to the drain region.

In order to electrically isolate the finFET from the underlying substrate, finFETs may typically be fabricated from a semiconductor-on-insulator (SOI) substrate, where the semiconductor fin may be separated from a base substrate by a buried insulator layer. FinFETs may also be fabricated from bulk substrates to reduce wafer cost and/or enable formation of certain devices in the bulk substrate. However, the fins of finFETs fabricated from bulk substrates are typically not electrically isolated from the substrate, potentially resulting in reduced device performance. Therefore, a method of fabricating finFETs from a bulk substrate so that the fins are electrically isolated from the bulk substrate may, among other things, be desirable.

SUMMARY

According to one exemplary embodiment of the present invention, a method of isolating a semiconductor fin from a substrate may include forming a hard mask layer on a top surface of the fin, forming a masking layer around a base portion of the fin, forming spacers on the top portion of the fin not covered by the masking layer, removing the masking layer to expose the base portion of the fin, and converting the base portion of the fin to an isolation region that electrically isolates the top portion of the fin from the substrate. The base portion of the fin may be converted to an isolation region by oxidizing the base portion of the fin by, for example, a thermal oxidation process.

In another embodiment of the invention, a semiconductor device may be formed by forming a fin on a bulk semiconductor substrate, forming a hard mask on the top surface of the fin, depositing an insulating layer on the bulk semiconductor substrate surrounding a first base portion of the fin, forming a sacrificial gate over the fin, depositing an interlevel dielectric layer around the sacrificial gate, removing the sacrificial gate to form a gate recess region exposing the fin, forming a masking layer around a second base portion of the fin above the first base portion of the fin, forming spacers on the sidewalls of the fin above the second base portion of the fin and above the masking layer, removing the masking layer to expose the second base portion of the fin, and converting the second base portion of the fin to an isolation region, so that the fin above the isolation region is electrically insulated from the bulk semiconductor substrate. The second base portion of the fin may be converted to an isolation region by oxidizing the second base portion of the fin by, for example, a thermal oxidation process.

Another embodiment of the invention may include a semiconductor structure including a substrate and a fin on the substrate including a top portion made of a semiconductor material and a bottom portion made of an insulating material that electrically isolates the top portion from the substrate. The substrate may be a bulk semiconductor substrate and the insulating material may be an oxide of the semiconductor material.

Figure 1A:
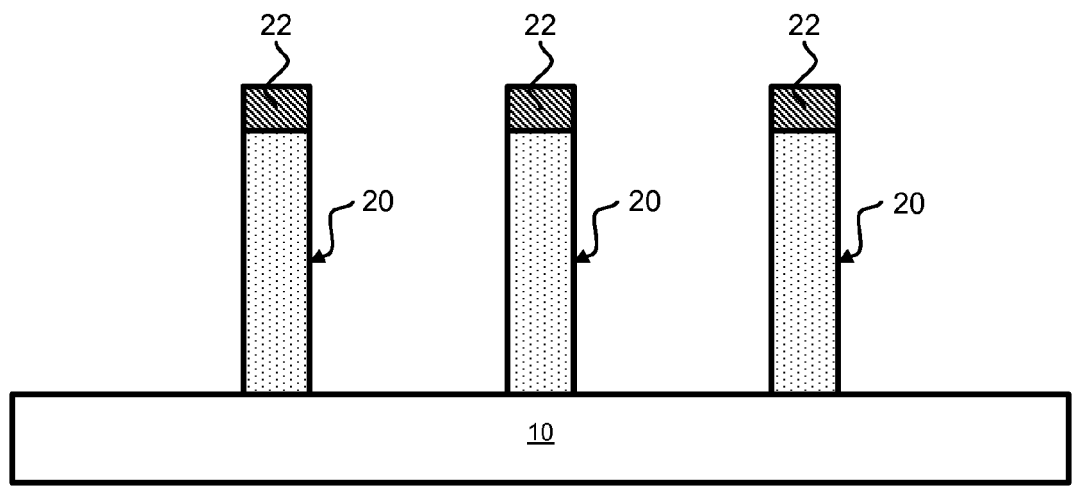
FIG. 1A is a side-view depicting semiconductor fins on a substrate, according to one embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments may include methods of forming semiconductor fins that are electrically isolated from an underlying substrate, as well as the resulting structure. As described below in conjunction with FIGS. 1A-1F, semiconductor fins may be formed on the substrate, a masking layer may be formed around base portions of the semiconductor fins, and spacers may be formed on the sidewalls of the fins above the masking layer. By then removing the masking layer, bottom portions of the fins may then be exposed while the remainders of the fins remain covered by the spacers. The bottom portions may then be converted into isolation regions in order to electrically isolate the remainders of the fins from the substrate, for example by thermally oxidizing the bottom portions of the fins. In this manner, electrically isolated fins may be fabricated without requiring a semiconductor-on-insulator (SOI) substrate, which may increase the cost and complexity of the fabrication process. The method described below in conjunction with FIGS. 1A-1F may be easily incorporated into typical semiconductor fabrication processes, such as the replacement metal gate (RMG) fin field effect transistor (finFET) process described below in conjunction with FIGS. 2A-2N.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention Referring to FIG. 1A, one or more fins 20 may be formed on a substrate 10. While the depicted embodiment includes three fins, it will be understood that embodiments may include as few as one fin, as well as more than three fins. In an exemplary embodiment, the fins 20 may have a width ranging from approximately 2 nm to approximately 100 nm, preferably approximately 4 nm to approximately 40 nm; and may have a height ranging from approximately 5 nm to approximately 300 nm, preferably approximately 10 nm to approximately 80 nm. The fins 20 may be separated by a distance ranging from approximately 20 nm to approximately 80 nm, preferably approximately 30 nm to approximately 50 nm.

The fins 20 may be formed, for example by removing material from the substrate 10 using a photolithography process followed by an anisotropic etching process such as reactive ion etching (RIE) or plasma etching. Other methods of forming fins known in the art may also be utilized, such as sidewall image transfer (SIT). The substrate 10 may be any substrate typically known in the art, including, for example, a bulk substrate made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In embodiments where the substrate 10 is a bulk substrate, the material of the fins 20 may be the same as the substrate 10 and there may be no identifiable boundary between the fins 20 and the substrate 10. Typically the substrate 10 may be about, but is not limited to, several hundred microns thick. For example, the base semiconductor layer may include a thickness ranging from 0.5 mm to about 1.5 mm.

In other embodiments, the substrate 10 may be an SOI substrate, where the fins 20 are formed by etching a top semiconductor layer separated from a base semiconductor substrate by a buried insulator layer (not shown). In such embodiments, the top semiconductor layer and the base semiconductor substrate may be made of the same materials as the bulk substrate discussed above. The buried insulator layer may be 100-500 nm thick, preferably about 200 nm. In such embodiments, the fins 20 may rest on the buried insulator layer, separated from the base semiconductor substrate.

While forming the fins 20, hard masks 22 may be formed above the fins 20 to protect the fins 20 during any etching processes. The hard masks 22 may be left above the fins 20 during subsequent processing steps, such as those described below in conjunction with FIGS. 1B-1F, to further protect the fins 20. The hard masks 22 may have a thickness ranging from approximately 30 nm to approximately 60 nm. The hard masks 22 may be made of an insulating material such as, for example, oxides, nitrides, oxynitrides of silicon, and combinations thereof. Oxides, nitrides and oxynitrides of other elements are also envisioned, as well as any other insulating material typically used for hard masks.

Figure 1B:
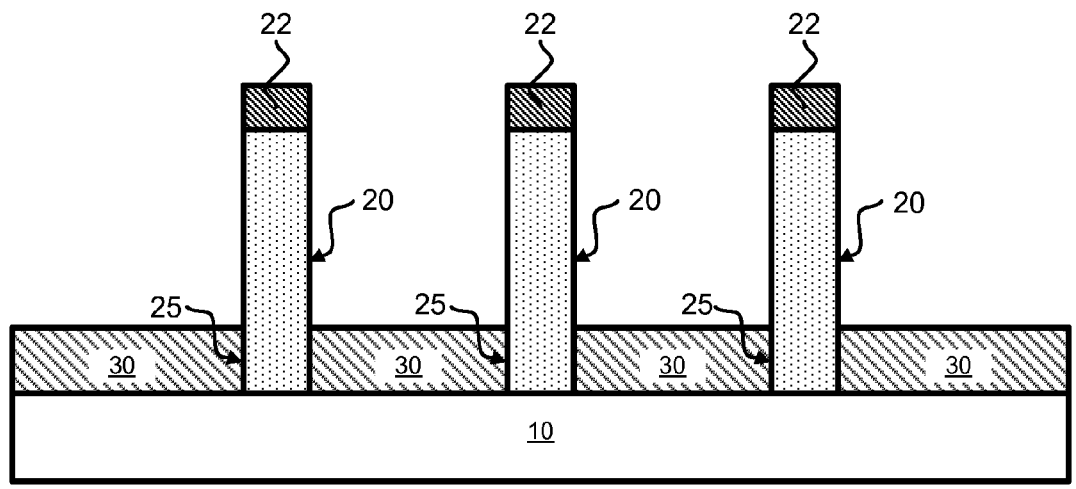
FIG. 1B is a side-view depicting forming a masking layer on the base of the semiconductor fins of FIG. 1A, according to one embodiment.

Referring to FIG. 1B, a masking layer 30 may be formed around the base of the fins 20, so that bottom portions 25 of the fins 20 are covered by the masking layer 30. The masking layer 30 may have a thickness ranging from approximately 10 nm to approximately 30 nm. Because the masking layer 30 will define the thickness of the oxidized portions of the fins 20 (See FIG. 1F), a thicker masking layer 30 will result in greater insulation between the fins 20 and the substrate 10, but also a reduction in the total semiconductor volume of the fins 20. A person of ordinary skill in the art while be able to determine the appropriate thickness of the masking layer 30 depending on the application.

The masking layer 30 may be made of any material capable of being removed selectively to the substrate 10, the fins 20, the hard masks 22, as well as the subsequently formed spacers 45 on the fins 20, as described below in conjunction with FIGS. 1C-1D. Suitable materials may include optical dispersive layers (ODLs). The masking layer 30 may be formed using typical deposition techniques, such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD), and typical etching and planarization techniques, such as chemical-mechanical planarization (CMP), reactive ion etching (RIE), and plasma etching. In a preferred embodiment, the masking layer 30 may be formed by depositing an ODL over the fins 20, planarizing the optical planarization layer, and then etching the optical planarization layer to the desired thickness. In some embodiments, other layers may be formed between the masking layer 30 and the substrate 10, such as the insulating layer 210 described below in conjunction with FIG. 2C.

Figure 1C:
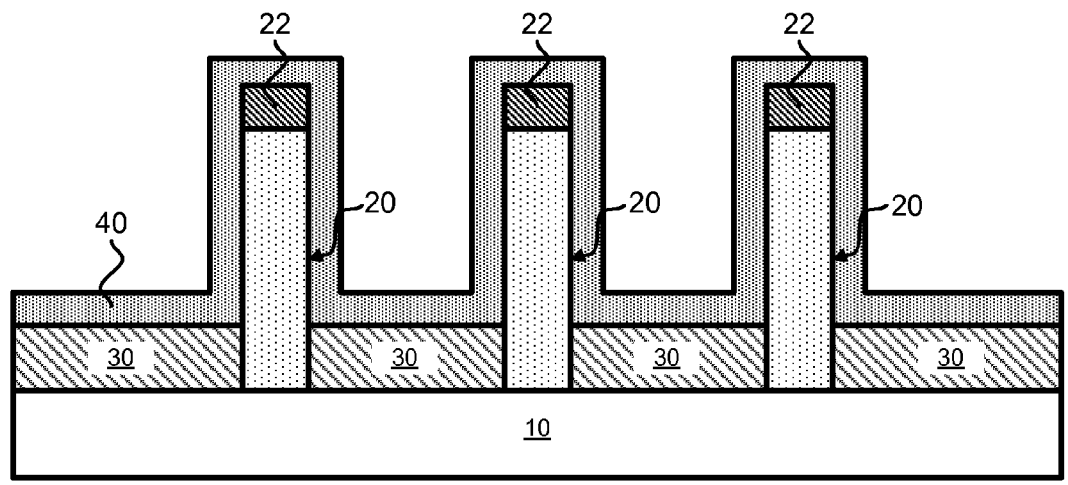
FIG. 1C is a side-view depicting depositing a conformal insulating layer over the semiconductor fins and masking layer of FIG. 1B, according to one embodiment.
Figure 1D:
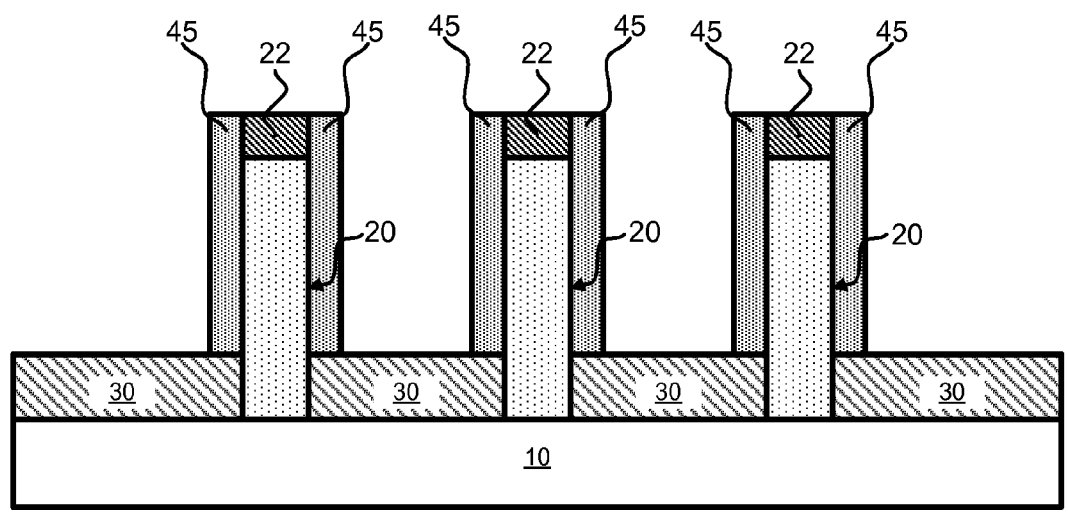
FIG. 1D is a side-view depicting forming spacers on the sidewalls of the fins of FIG. 1C above the masking layer, according to one embodiment.

Referring to FIGS. 1C-1D, spacers 45 (FIG. 1D) may be formed on the sidewalls of the fins 20 above the masking layer 30 to protect the fins 20 during the subsequent oxidation process described below in conjunction with FIG. 1F. The spacers 45 may have a thickness ranging approximately 5 nm to approximately 10 nm, and may be made of any material typically used in semiconductor fabrication, such as oxides, nitrides, oxynitrides of silicon, as well as oxides, nitrides, oxynitrides of other elements, and combinations thereof. Depending on the material selected, the thickness of the spacers 45 should be sufficient to prevent oxidation of the fins 20 during the subsequent oxidation step described below in conjunction with FIG. 1F. The material of the spacers 45 may be chosen so that the masking layer 30 may be selectively removed without substantially removing the spacers 45. The material of the spacers 45 may also be chosen so that the spacers 45 may also be removed selective to the substrate 10 and the fins 20. In an exemplary embodiment, the spacers 45 may be made of silicon nitride and have a thickness of ranging approximately 5 nm to approximately 8 nm.

The spacers 45 may be formed by first depositing a conformal layer 40 of the desired material over the fins 20 and the masking layer 30, as depicted in FIG. 1C. The conformal layer 40 may be deposited using typical deposition techniques known in the art, such as ALD, CVD, PVD, MBD, and PLD. After deposition, the conformal layer 40 may be etched using typical anisotropic etching techniques to remove the conformal layer 40 from undesired surfaces, as depicted in FIG. 1D. Exemplary anisotropic etching techniques include RIE and plasma etching.

Figure 1E:
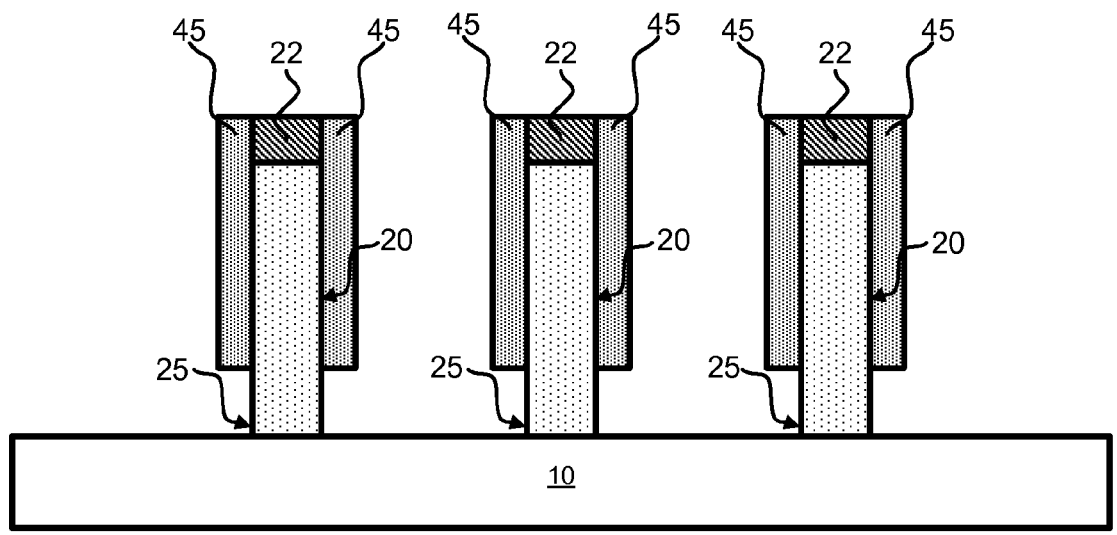
FIG. 1E is a side-view depicting removing the masking layer to expose base portions of the semiconductor fins of FIG. 1D, according to one embodiment.

Referring to FIG. 1E, the masking layer 30 may be removed to expose the base portions 25 of the fins 20. The masking layer 30 may be removed using any typical etching process capable of selectively removing the masking layer 30 without substantially removing material from the substrate 10, the fins 20, the hard masks 22, and the spacers 45. Suitable etch processes may include dry etches, such as RIE, plasma etching, or laser ablation, or wet etches. In an embodiment, the masking layer 30 may be removed by a wet etching process using diluted hydrofluoric acid.

Figure 1F:
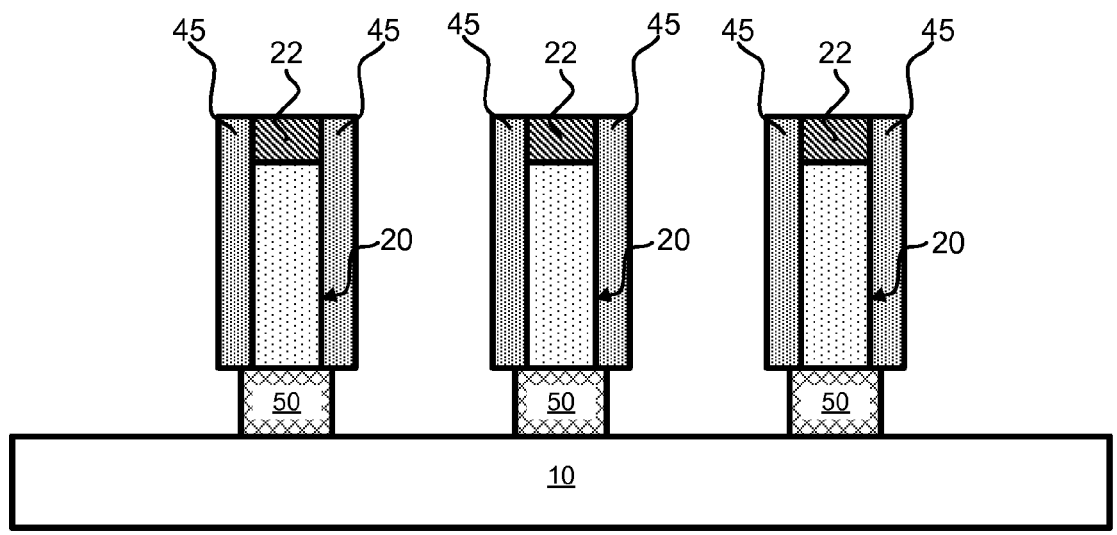
FIG. 1F is a side-view depicting oxidizing the base portions of the semiconductor fins of FIG. 1E, according to one embodiment.

Referring to FIG. 1F, the base portions 25 (FIG. 1E) of the fins 20 may be converted into isolation regions 50 to electrically insulate the fins 20 from the substrate 10. In a preferred embodiment, a thermal oxidation process may be used to form the isolation regions 50, where the base portions 25 are heated in the presence of oxygen, so that oxygen diffuses into the base portions 25. In an exemplary embodiment, the base portions 25 may be placed in an oxygen-containing environment at a temperature of approximately 900° C. to approximately 1000° C. for approximately 10 minutes to approximately 30 minutes. In other embodiments, the oxygen may be substituted for other insulating atoms, such as nitrogen. In further additional embodiments, an ion implantation process may be used to implant insulating ions, such as oxygen or nitrogen, into the base portions 25.

The process described above to isolate fins from a substrate may be used in a variety of applications. One such application may be the fabrication of a finFET formed on a bulk substrate, as described below in conjunction with FIGS. 2A-2N. Because it may be desirable for the fins of a finFET to be electrically insulated from the underlying substrate, finFETs may typically be fabricated on SOI substrates. However, SOI substrates introduce additional costs into the fabrication process relative to bulk substrates. By integrating the fin isolation process described above in conjunction with FIGS. 1A-1F into the finFET fabrication process, finFETs having electrically insulated fins may be fabricated on a bulk substrate.

Figure 2A:
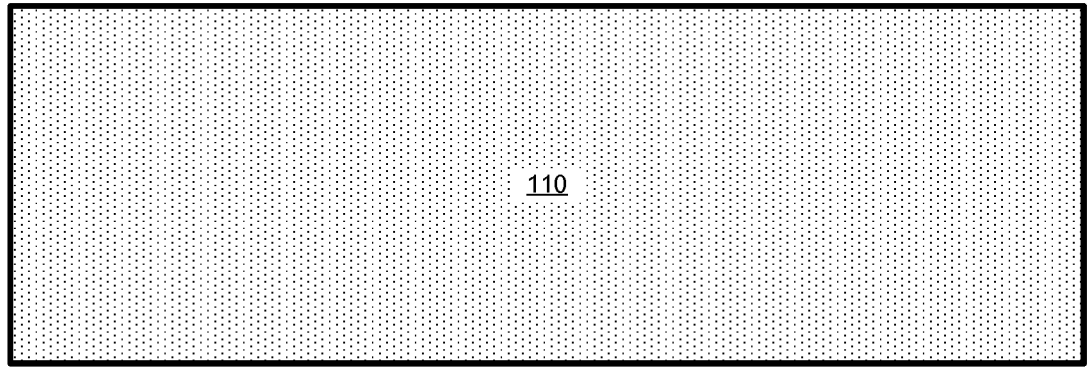
FIG. 2A is a side-view depicting a bulk semiconductor substrate, according to one embodiment.

Referring to FIG. 2A, a bulk semiconductor substrate 110 may be provided. The bulk semiconductor substrate 110 made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base bulk semiconductor substrate 110 may be about, but is not limited to, several hundred microns thick. For example, the base semiconductor layer may include a thickness ranging from 0.5 mm to about 1.5 mm.

Figure 2B:
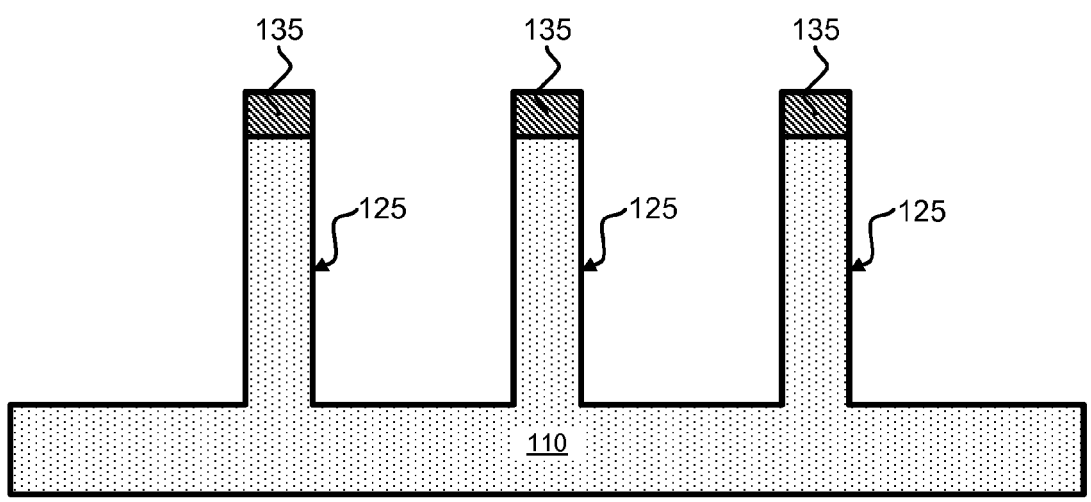
FIG. 2B is a side-view depicting forming fins in the bulk semiconductor substrate of FIG. 2A, according to one embodiment.

Referring to FIG. 2B, one or more fins 125 may be formed in the bulk semiconductor substrate 110. While the depicted embodiment includes three fins, it will be understood that embodiments may include as few as one fin, as well as more than three fins. In an exemplary embodiment, the fins 125 may have a width ranging from approximately 2 nm to approximately 100 nm, preferably approximately 4 nm to approximately 40 nm; and may have a height ranging from approximately 5 nm to approximately 300 nm, preferably approximately 10 nm to approximately 80 nm. The fins 125 may be separated by a distance ranging from approximately 20 nm to approximately 80 nm, preferably approximately 30 nm to approximately 50 nm.

The fins 125 may be formed, for example by removing material from the bulk semiconductor substrate 110 using a photolithography process followed by an anisotropic etching process such as reactive ion etching (RIE) or plasma etching. Other methods of forming fins known in the art may also be utilized, such as sidewall image transfer (SIT).

While forming the fins 125, hard masks 135 may be formed above the fins 125 to protect the fins 125 during the fin fabrication process. The hard masks 135 may be left above the fins 125 during subsequent process steps, such as those described below in conjunction with FIGS. 2C-2L, to further protect the fins 125. The hard masks may have a thickness ranging from approximately 30 nm to approximately 60 nm. The hard masks 135 may be made of an insulating material such as, for example, oxides, nitrides, oxynitrides of silicon, and combinations thereof. Oxides, nitrides and oxynitrides of other elements are also envisioned, as well as any other insulating material typically used for hard masks.

Figure 2C:
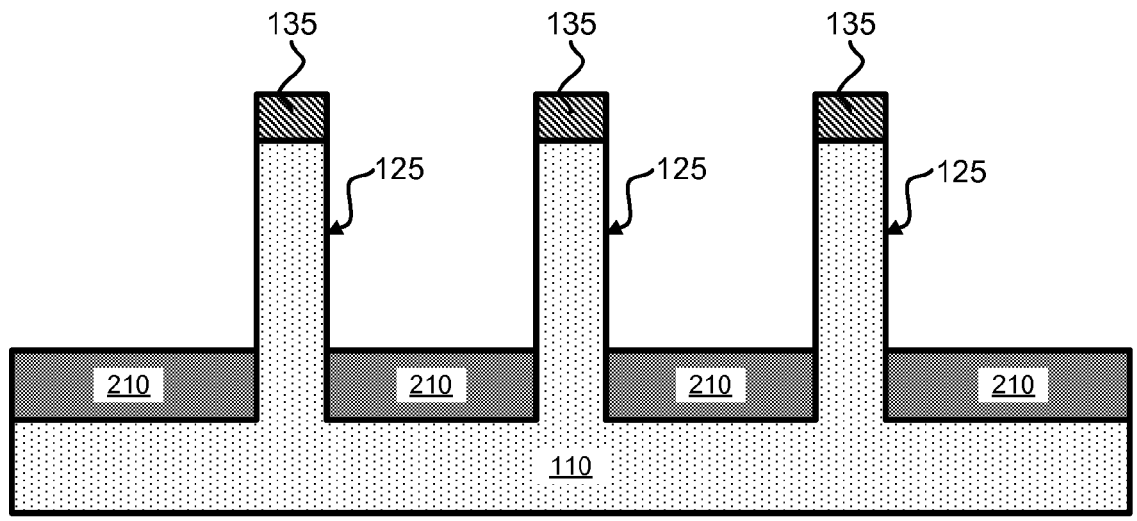
FIG. 2C is a side-view depicting forming an insulating layer on the bulk semiconductor substrate between the fins of FIG. 2B, according to one embodiment.

Referring to FIG. 2C, an insulating layer 210 may formed above the substrate 110 surrounding the bottom of the fins 125. The insulating layer 210 may be made of any typical insulating material known in the art, including oxides, nitrides, oxynitrides of silicon, as well as oxides, nitrides, oxynitrides of other elements, and combinations thereof. In a preferred embodiment, the insulating layer 210 may consist of silicon oxide. The insulating layer 210 may have a thickness sufficient to electrically insulate the substrate 110 from structures subsequently formed above the insulating layer 210. In an exemplary embodiment, the insulating layer 210 may have a thickness ranging from approximately 10 nm to approximately 30 nm. It may be noted that at this stage of the fabrication process, the fins 125 are still in electrical contact with the substrate 210, as the insulating layer 210 does not separate the fins 125 from the substrate 210.

Figure 2D:
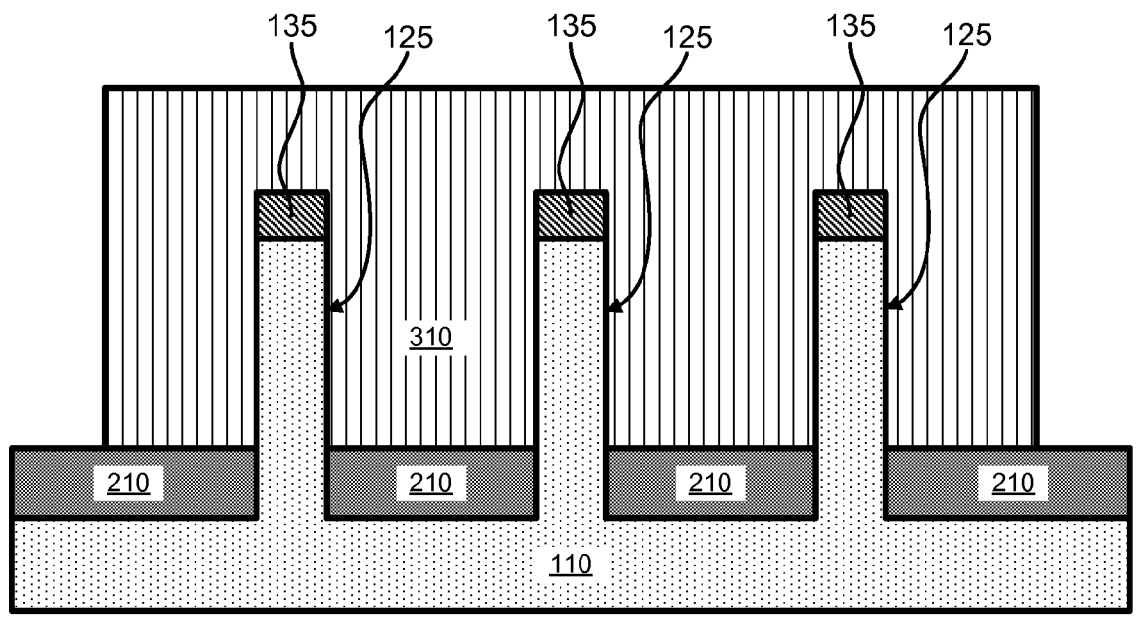
FIG. 2D is a side-view depicting forming a sacrificial gate over the fins, according to one embodiment.

Referring to FIG. 2D, a sacrificial gate 310 may be formed over the fins 125 and above the insulating layer 210. The sacrificial gate 310 may have a height ranging from approximately 100 nm to approximately 150 nm, so that the sacrificial gate 310 covers the fins 125. In an exemplary embodiment, the sacrificial gate 310 may include a sacrificial dielectric layer and a sacrificial gate electrode (not shown). The sacrificial dielectric layer may be made of any known dielectric materials such as silicon oxide or silicon nitride. The sacrificial gate electrode may be made of, for example, an amorphous or polycrystalline silicon material. The sacrificial gate 310 may be formed using typical deposition techniques known in the art, such as ALD, CVD, PVD, MBD, and PLD.

After forming the sacrificial gate, source/drain regions may also be formed over portions of the fins outside of the gate. Because the source/drain regions are formed outside the plane of FIGS. 2A-2N and are not relevant to the method of isolating the fins 125 from the substrate 110, they are not shown. Methods of forming source/drain regions are well known in the art and a person of ordinary skill in the art will understand how to form source/drain regions without requiring further discussion herein.

Figure 2E:
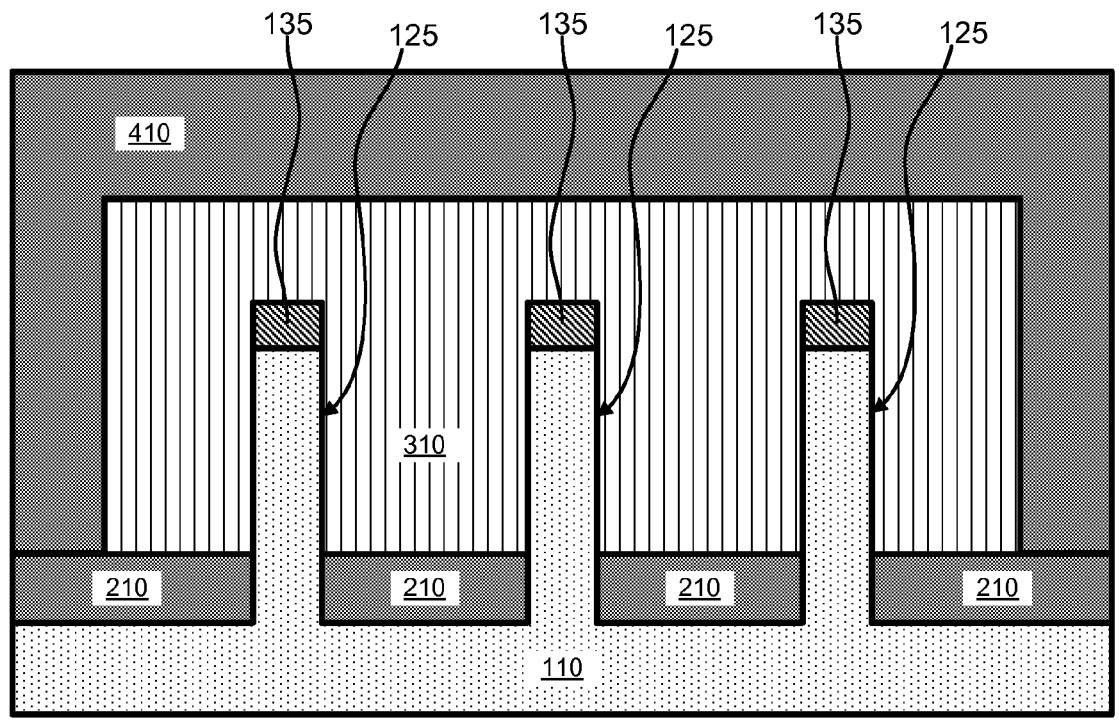
FIG. 2E is a side-view depicting depositing an interlevel dielectric (ILD) layer over the sacrificial gate, according to one embodiment.

Referring to FIG. 2E, an interlevel dielectric (ILD) layer 410 may deposited over the sacrificial gate 310. The ILD layer 410 may a thickness greater than the height of the sacrificial gate 310. The ILD layer 410 may be made of any suitable dielectric material such as, for example, silicon oxide, silicon nitride, hydrogenated silicon carbon oxide, silicon based low-k dielectrics, porous dielectrics, or organic dielectrics including porous organic dielectrics. In some embodiments, the ILD layer 410 may be made of the same material as the insulating layer 210, so that the ILD layer 410 is indistinguishable from the insulating layer 210 after its deposition. The ILD layer 410 may be deposited using typical deposition techniques known in the art, such as ALD, CVD, PVD, MBD, and PLD.

Figure 2F:
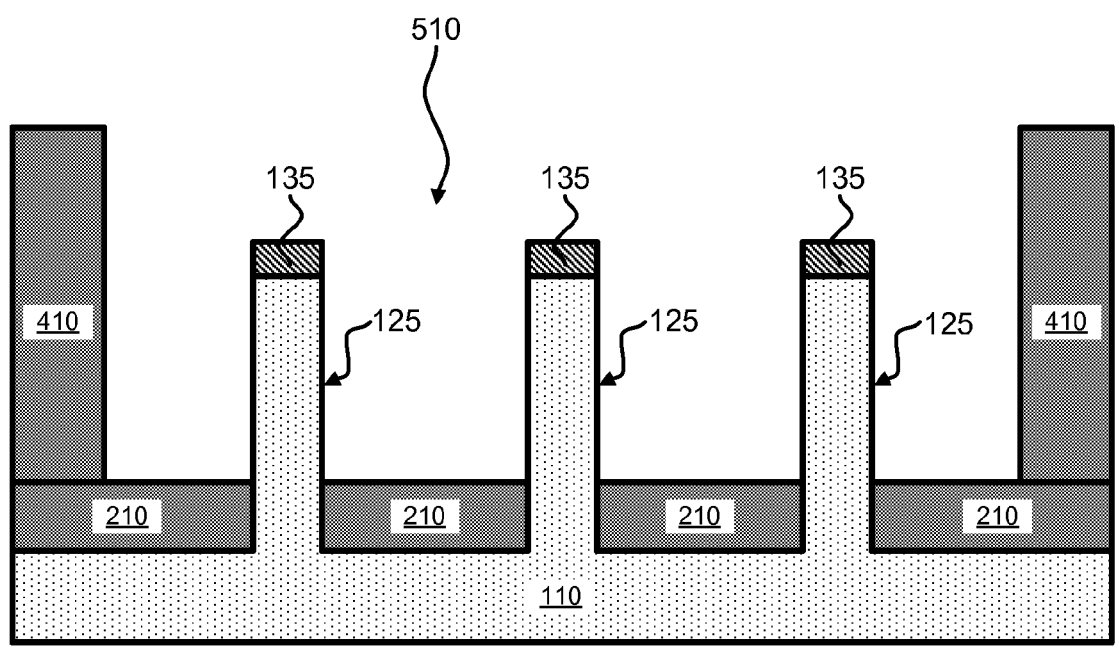
FIG. 2F is a side-view depicting removing the sacrificial gate to form a gate recess region, according to one embodiment.

Referring to FIG. 2F, the sacrificial gate 310 (FIG. 2E) may be removed to form a gate recess region 510 that exposes the fins 125. The boundaries of the gate recess region 510 may be defined as the insulating layer 210 at the bottom and the ILD layer 410 on the sides. The sacrificial gate 310 may be removed by first planarizing the ILD layer 410 using the sacrificial gate 310 as a planarization stop, so that the sacrificial gate 310 is exposed. The sacrificial gate 310 may then be removed using typical etch processes capable of removing the sacrificial gate 310 without substantially removing material from the ILD layer 410, the insulating layer 210, the fins 125, and the hard masks 135. Suitable etch processes may include dry etches, such as RIE, plasma etching, or laser ablation, or wet etches. The etching process may involve multiple steps with different etch chemistries to separately remove components of the sacrificial gate 310 made of different materials, such as the sacrificial gate dielectric layer and the sacrificial gate electrode.

Figure 2G:
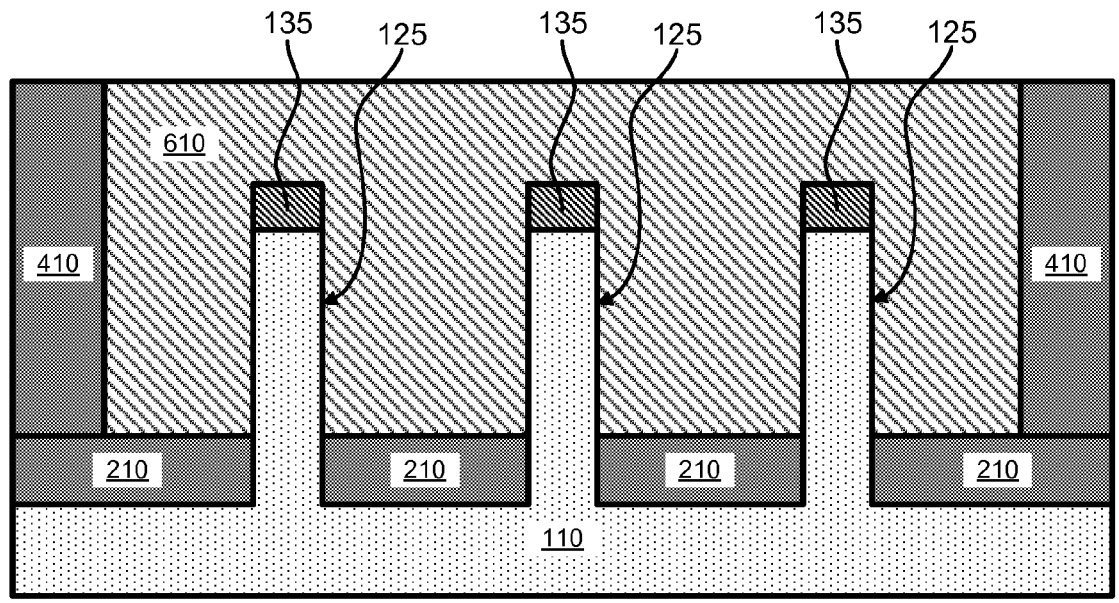
FIG. 2G is a side-view depicting filling the gate recess region with a masking material, according to one embodiment.
Figure 2H:
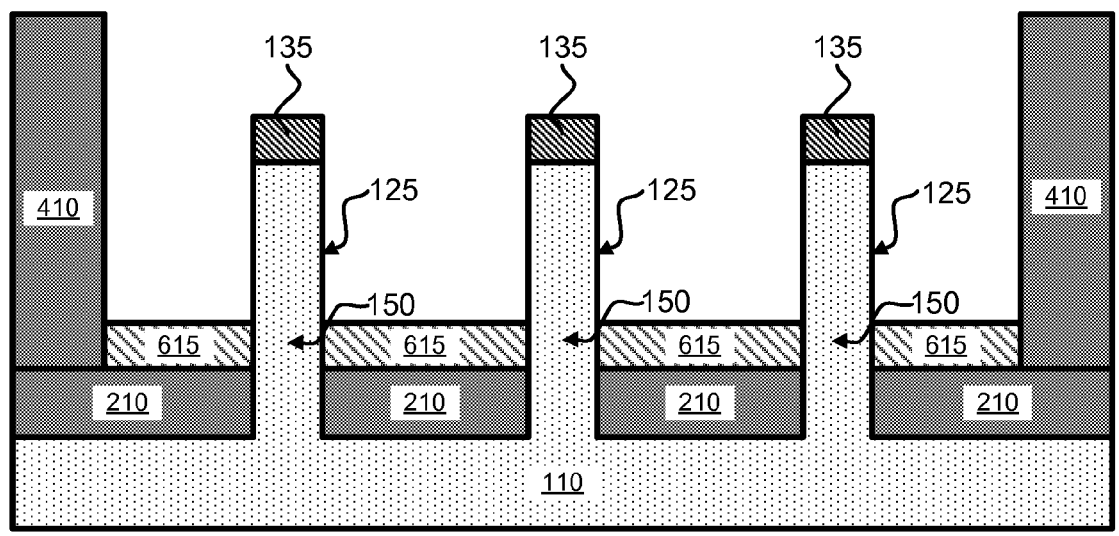
FIG. 2H is a side-view depicting forming masking layers covering base portions of the fins, according to one embodiment.

Referring to FIGS. 2G-2H, a masking layer 615 (FIG. 2G) may be formed around the base of the fins 125, so that bottom portions 150 of the fins 125 are covered by the masking layer 615. The masking layer 615 may have a thickness ranging from approximately 10 nm to approximately 30 nm. Because the masking layer 615 will define the thickness of the oxidized portions of the fins 125 (See FIG. 1F), a thicker masking layer 615 will result in greater insulation between the fins 125 and the substrate 110, but also a reduction in the total semiconductor volume of the fins 125. A person of ordinary skill in the art while be able to determine the appropriate thickness of the masking layer 615 depending on the application.

The masking layer 615 may be made of any material capable of being removed selective to the substrate 110, the fins 125, the hard masks 135, as well as the subsequently formed spacers 715 on the fins 125, as described below in conjunction with FIGS. 1C-1D. Suitable materials may include ODLs. The masking layer 615 may be formed using typical deposition techniques, such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD), and typical etching and planarization techniques, such as chemical-mechanical planarization (CMP), reactive ion etching (RIE), and plasma etching. In a preferred embodiment, the masking layer 615 may be formed by depositing an ODL 610 over the fins 125 (FIG. 2G), planarizing the optical planarization layer and then etching the optical planarization layer to the desired thickness (FIG. 2H).

Figure 2I:
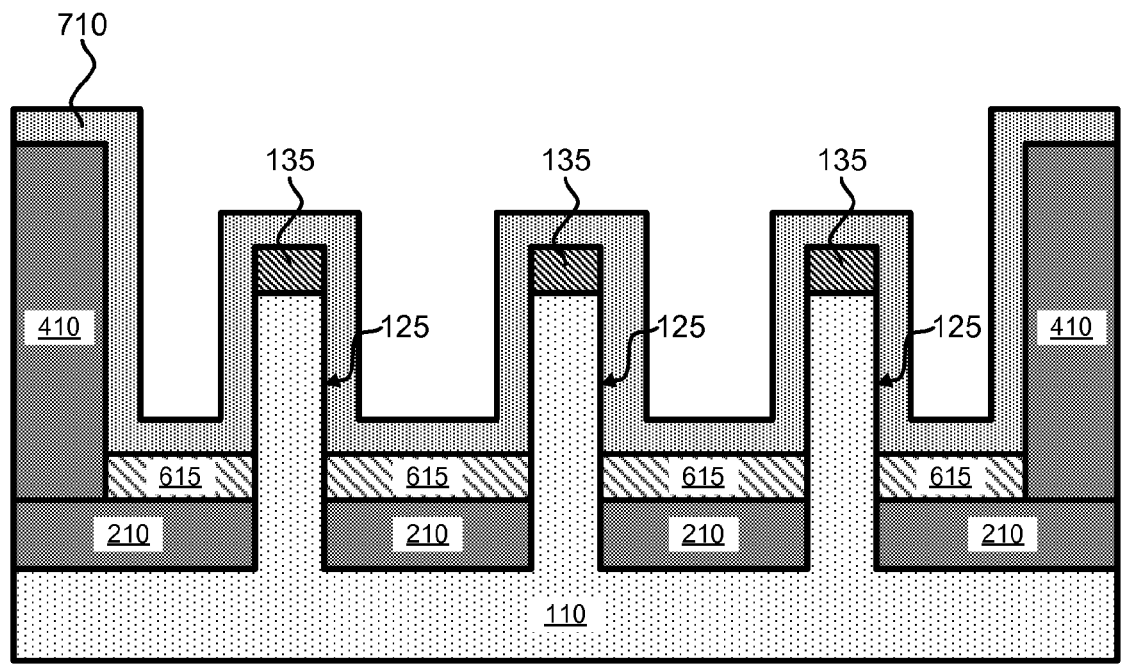
FIG. 2I is a side-view depicting depositing a conformal insulating layer in the gate recess region, according to one embodiment.
Figure 2J:
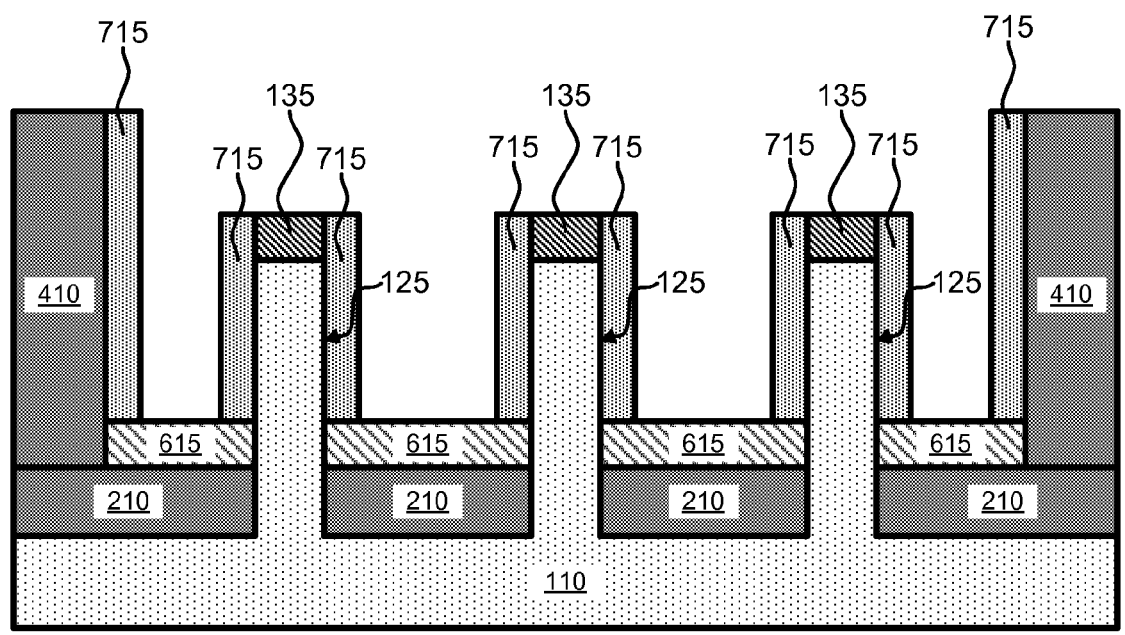
FIG. 2J is a side-view depicting forming spacers on the portions of the fins not covered by the masking layers, according to one embodiment.

Referring to FIG. 2I-2J, spacers 715 (FIG. 1D) may be formed on the sidewalls of the fins 125 above the masking layer 615 to protect the fins 125 during the subsequent oxidation process described below in conjunction with FIG. 2L. The spacers 715 may have a thickness ranging approximately 5 nm to approximately 10 nm, and be made of any material typically used in semiconductor fabrication, such as oxides, nitrides, oxynitrides of silicon, as well as oxides, nitrides, oxynitrides of other elements, and combinations thereof. Depending on the material selected, the thickness of the spacers 715 may be sufficient to prevent oxidation of the fins 125 during the subsequent oxidation step described below in conjunction with FIG. 2L. The material of the spacers 715 may be chosen so that the masking layer 615 may be selectively removed without substantially removing the spacers 715. The material of the spacers 715 may also be chosen so that the spacers 715 may also be removed selective to the insulating layer 210 and the fins 125. In an exemplary embodiment, the spacers 715 may be made of silicon nitride and have a thickness of ranging approximately 5 nm to approximately 8 nm.

The spacers 715 may be formed by first depositing a conformal layer 710 of the desired material over the fins 125 and the masking layer 210, as depicted in FIG. 2I. The conformal layer 710 may be deposited using typical deposition techniques known in the art, such as ALD, CVD, PVD, MBD, and PLD. After deposition, the conformal layer 710 may be etched using typical anisotropic etching techniques to remove the conformal layer 710 from undesired surfaces, as depicted in FIG. 2J. Exemplary anisotropic etching techniques include RIE and plasma etching.

Figure 2K:
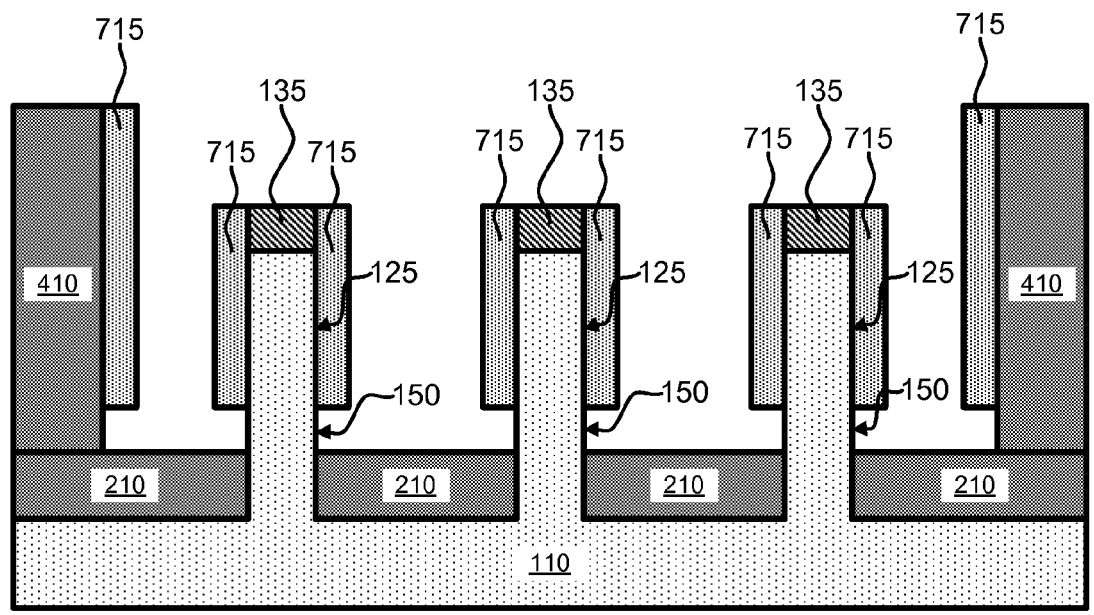
FIG. 2K is a side-view depicting removing the masking layers, according to one embodiment.

Referring to FIG. 2K, the masking layer 615 may be removed to expose the base portions 150 of the fins 125. The masking layer 615 may be removed using any typical etching process capable of selectively removing the masking layer 615 without substantially removing material from the insulating layer 210, the fins 125, the hard masks 135, and the spacers 715. Suitable etch processes may include dry etches, such as RIE, plasma etching, or laser ablation, or wet etches. In an embodiment, the masking layer 615 may be removed by may be removed by a wet etching process using diluted hydrofluoric acid.

Figure 2L:
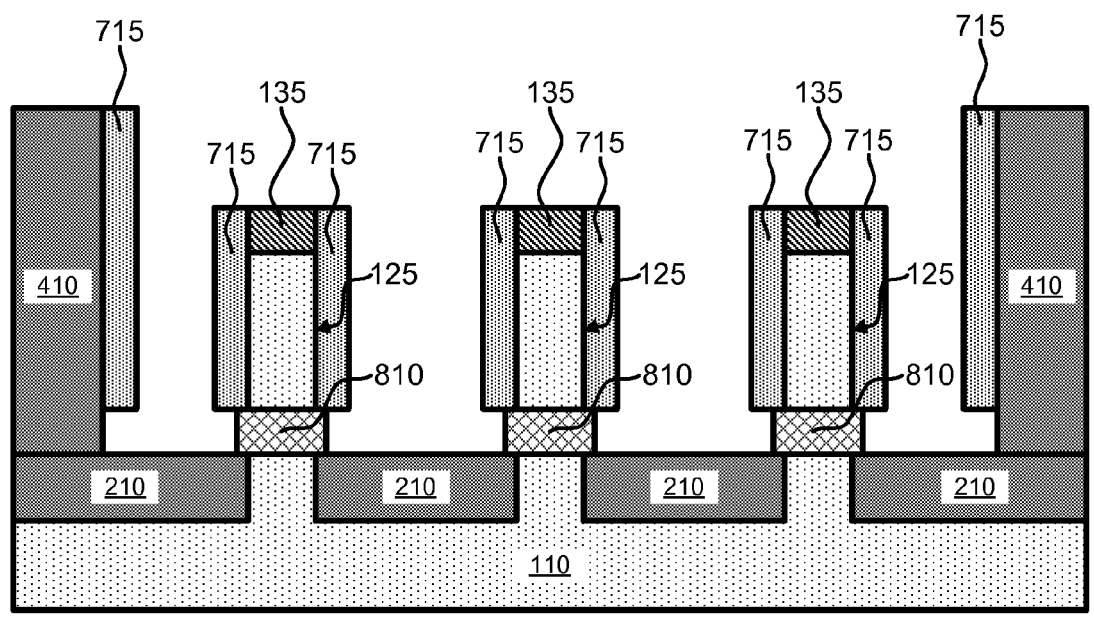
FIG. 2L is a side-view depicting oxidizing the base portions of the fins, according to one embodiment.

Referring to FIG. 2L, the base portions 150 (FIG. 2K) of the fins 125 may be converted into isolation regions 810 to electrically insulate the fins 125 from the substrate 110. In a preferred embodiment, the isolation regions 810 may be formed using a thermal oxidation process, in which the base portions 150 are heated in the presence of oxygen, so that oxygen diffuses into the base portions 150. In an exemplary embodiment, the base portions 150 may be placed in an oxygen-containing environment at a temperature of approximately 900° C. to approximately 1000° C. for approximately 10 minutes to approximately 30 minutes. In other embodiments, the oxygen may be substituted for other insulating atoms such as nitrogen. In further additional embodiments, an ion implantation process may be used to implant insulating ions, such as oxygen or nitrogen, into the base portions 150.

Figure 2M:
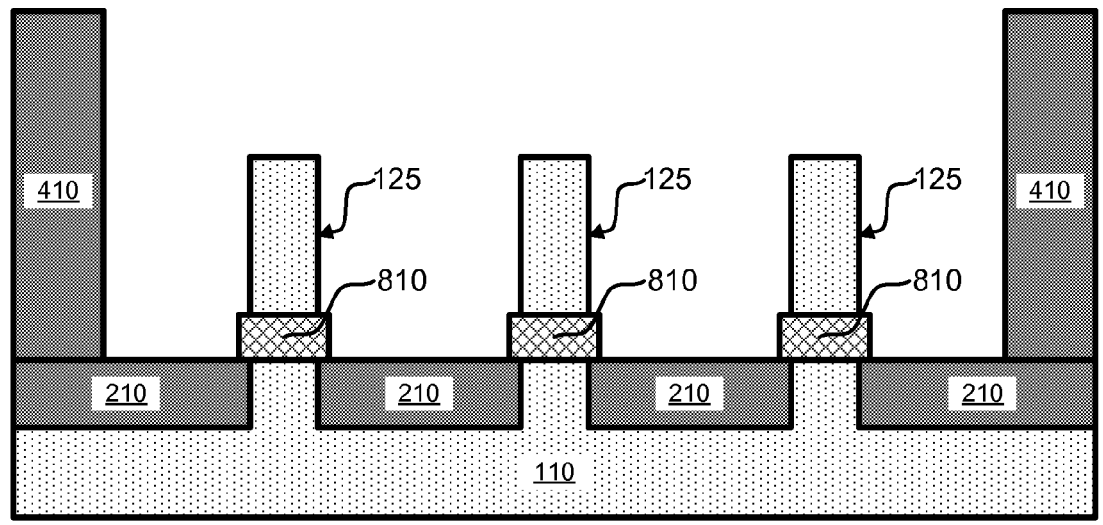
FIG. 2M is a side-view depicting removing the spacers, according to one embodiment.

Referring to FIG. 2M, the spacers 710 (FIG. 2L) and the hard masks 135 (FIG. 2L) may be removed from the fins 125 using any suitable etching process known in the art capable of removing the spacers 710 and the hard masks 135 without substantially removing material from the ILD layer 410, the insulating layer 210, the fins 125, or the isolation regions 810. Suitable etch processes may include dry etches, such as RIE, plasma etching, or laser ablation, or wet etches.

Figure 2N:
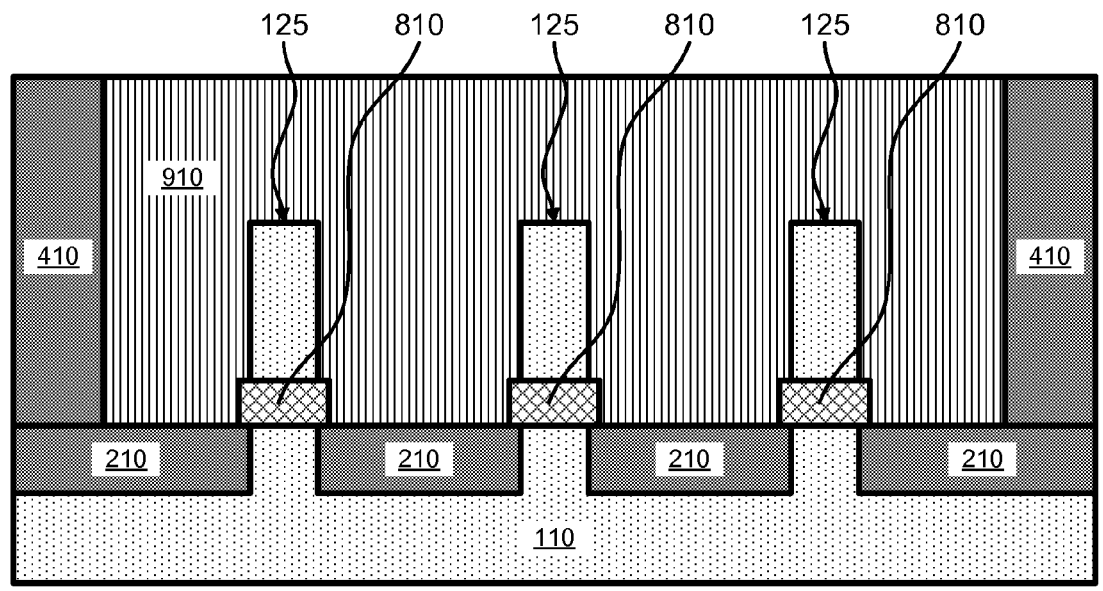
FIG. 2N is a side-view depicting forming a replacement metal gate (RMG) in the gate recess region, according to one embodiment.

Referring to FIG. 2N, a replacement metal gate 910 may be formed in the gate recess region 510 (FIG. 2M) in contact with the fins 125. The replacement metal gate 910 may include a gate dielectric layer and a gate electrode layer (not shown). The gate dielectric layer and the gate electrode layer may be deposited by any suitable technique known in the art, for example by ALD, CVD, PVD, MBD, PLD, or LSMCD. The gate dielectric layer may include an insulating material including, but not limited to: oxide, nitride, oxynitride, or silicate (including metal silicates and nitrided metal silicates). In one embodiment, the gate dielectric layer may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric layer may vary, but typically may have a thickness ranging from approximately 0.5 nm to approximately 10 nm. The gate electrode layer may be formed on top of the gate dielectric. The gate electrode layer may include, for example, Zr, W, Ta, Hf, Ti, Al, Ru, Pa, metal oxides, metal carbides, metal nitrides, transition metal aluminides (e.g. $Ti_3Al$, ZrAl), TaC, TiC, TaMgC, or any combination of those materials. The gate electrode layer may also include a silicon layer located on top of a metal material, whereby the top of the silicon layer may be silicided. Some embodiments may further include one or more work function metal layers deposited between the gate dielectric layer and the gate electrode.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

The invention claimed is:

1. A method of isolating a semiconductor fin from a substrate, the method comprising:
   forming a hard mask layer on a top surface of the fin;
   forming a masking layer around a base portion of the fin and the substrate;
   forming spacers on a top portion of the fin above the masking layer;
   removing the masking layer to expose the base portion of the fin and the substrate; and
   forming an isolation region from the base portion of the fin, the isolation region electrically insulating the top portion of the fin from the substrate, wherein forming an isolation region from the base portion of the fin comprises oxidizing or nitriding the base portion of the fin, and wherein the oxidizing or nitriding comprises performing an ion implantation of the isolation region with a species selected from the group consisting of oxygen and nitrogen.

2. The method of claim 1, wherein the masking layer comprises an optical dispersive layer.

3. The method of claim 1, wherein the masking layer has a thickness ranging from approximately 10 nm to approximately 30 nm.

4. The method of claim 1, wherein the spacers have a thickness sufficient to prevent the top portion of the fin from being converted to an isolation region while forming an isolation region from the base portion of the fin.

5. The method of claim 1, wherein the substrate comprises a bulk semiconductor substrate.

6. A method of forming a semiconductor device, the method comprising:
   forming a fin on a bulk semiconductor substrate, wherein the fin has a top surface and sidewalls;
   forming a hard mask on the top surface of the fin
   depositing an insulating layer on the bulk semiconductor substrate, wherein the insulating layer surrounds a first base portion of the fin adjacent to the bulk semiconductor substrate;
   forming a sacrificial gate over the fin;
   depositing an interlevel dielectric layer around the sacrificial gate;
   removing the sacrificial gate to form a gate recess region exposing the fin;
   forming a masking layer around a second base portion of the fin above the first base portion of the fin;
   forming spacers on the sidewalls of the fin above the masking layer;
   removing the masking layer to expose the second base portion of the fin and the insulating layer;
   forming an isolation region from the second base portion of the fin, the isolation region electrically insulating the fin above the isolation region from the bulk semiconductor substrate, and wherein forming an isolation region from the second base portion of the fin comprises oxidizing or nitriding the second base portion of the fin, and further comprising performing an ion implantation of the isolation region with a species selected from the group consisting of oxygen and nitrogen.

7. The method of claim 6, wherein the masking layer comprises an optical dispersion layer.

8. The method of claim 6, wherein the masking layer has a thickness ranging from approximately 10 nm to approximately 30 nm.

9. The method of claim 6, wherein the spacers have a thickness sufficient to prevent the portion of the fin above the second base portion from being converted to an isolation region while forming an isolation region from the second base portion of the fin.

10. The method of claim 6, wherein the substrate comprises a bulk semiconductor substrate.

11. The method of claim 1, wherein the masking layer includes an optical dispersive layer (ODL).

12. The method of claim 6, wherein the masking layer includes an optical dispersive layer (ODL).

* * * * *